United States Patent
Pelley

(10) Patent No.: US 6,760,268 B2
(45) Date of Patent: Jul. 6, 2004

(54) METHOD AND APPARATUS FOR ESTABLISHING A REFERENCE VOLTAGE IN A MEMORY

(75) Inventor: Perry H. Pelley, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 37 days.

(21) Appl. No.: 10/304,662

(22) Filed: Nov. 26, 2002

(65) Prior Publication Data

US 2004/0100846 A1 May 27, 2004

(51) Int. Cl.$^7$ .............................................. G11C 11/00
(52) U.S. Cl. .................. 365/210; 365/158; 365/189.07; 365/207
(58) Field of Search ................................. 365/158, 207, 365/210, 189.07, 189.09, 185.2

(56) References Cited

U.S. PATENT DOCUMENTS

| | | | | |
|---|---|---|---|---|
| 4,961,166 A | * | 10/1990 | Sato et al. | ............. 365/189.01 |
| 5,325,337 A | * | 6/1994 | Buttar | ........................ 365/210 |
| 6,097,623 A | | 8/2000 | Sakata | ........................ 365/145 |
| 6,147,896 A | * | 11/2000 | Kim et al. | ................... 365/145 |
| 6,381,187 B1 | | 4/2002 | Lee | ............................. 365/207 |
| 6,525,979 B2 | * | 2/2003 | Kato | .......................... 365/210 |
| 6,567,330 B2 | * | 5/2003 | Fujita et al. | ................. 365/210 |
| 2002/0141232 A1 | | 10/2002 | Saito | |

* cited by examiner

Primary Examiner—Tan T. Nguyen
(74) Attorney, Agent, or Firm—Daniel D. Hill; Robert I. King

(57) ABSTRACT

A memory (110) uses memory cells not intended for user programming referred to as 'dummy' cells (202, 206). When selected, the dummy cells provide a current that establishes a reference voltage substantially equal to one-half of voltage created in a bit line by a cell programmed to a one and a cell programed to a zero. The reference voltage is sensed and compared with a bit line voltage created when a memory cell is read. By time multiplexing either one dummy cell programmed to a logic one or two dummy cells per bit line programmed respectively to logic one and logic zero, the desired reference voltage is accurately created. Memories such as MRAM and Flash that may be is difficult to accurately sense due to cell processing variations are enhanced by the timed selective use of one or more dummy cells.

20 Claims, 5 Drawing Sheets

METHOD AND APPARATUS FOR ESTABLISHING A REFERENCE VOLTAGE IN A MEMORY

FIELD OF THE INVENTION

This invention relates generally to integrated circuit memories, and more particularly to establishing a reference voltage in a memory.

BACKGROUND OF THE INVENTION

Many memory types, such as EPROM (electrically programmable read only memory), flash, MRAM (magnetoresistive random access memory), and one-transistor DRAM (dynamic random access memory) are single-ended. That is, each memory cell is sensed using a single bit line. This is unlike an SRAM (static random access memory), where each memory cell is connected to a bit line pair. To allow differential sensing in memory types that traditionally use single-ended sensing, a reference voltage or current may be established with which to compare the state stored in a selected memory cell. The reference voltage or current is generally about half-way between a logic high voltage and a logic low voltage of the memory cell.

Several techniques have been used in the past to generate the reference voltage for memories using voltage sensing. One technique used to generate the reference voltage depends on the use of "dummy cells". A dummy cell is manufactured using the same process technology as the normal cells of a memory array in order to model the behavior of the normal cells as closely as possible. However, the dummy cell will be physically smaller to generate a reference voltage that is between a logic high voltage and a logic low voltage for the cell. The problem with this technique is that reducing geometries of the cells produces process problems in keeping the current ratio of the dummy cell relative to the normal cell constant.

Another technique for producing the reference voltage is to connect normal sized dummy cells in series or parallel combinations. One of the cells will be programmed to read a "zero" state and the other programmed to read a "one" logic state to produce the required reference voltage. However, this technique may create errors due to the non-linearity of the cell resistance with voltage.

Yet another technique involves the use of current mirrors to establish the reference voltage. However, current mirrors sometimes do not produce the desired current with an acceptable degree of accuracy.

Therefore, there is a need for a circuit that can generate a more accurate reference voltage in a memory cell that uses single-ended sensing.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides an apparatus and method to generate an accurate reference voltage for differential sensing of a single-ended memory. In the memory, the bit lines are organized as bit line pairs. Each bit line pair is coupled to a differential sense amplifier. In one embodiment, the memory is a nonvolatile memory. Each bit line of the array will have a pair of selectable dummy cells. The dummy cells will be physically identical to the normal cells of the array. Each dummy cell of the pair will be connected to a separate dummy word line. One of the dummy cells will be programmed to a logic high state and the other dummy cell with be programmed to a logic low state. During a read cycle, prior to enabling the sense amplifier, the logic high cell will be coupled to the selected bit line for a first predetermined time period, and then the logic low cell will be coupled to the bit line for a second predetermined time period. The reference voltage will be determined by the length of the first and second predetermined time periods. Preferably the first predetermined time period and the second predetermined time period will be the same, allowing the reference voltage to be about half way between the logic high voltage and the logic low voltage.

In another embodiment, the memory may include volatile or non-volatile memory cells that use single-ended bit cells. The bit cells, or memory cells, are coupled to bit lines. The bit lines are organized into bit line pairs, and each bit line pair is coupled to a sense amplifier. Each bit line of the array will have one selectable dummy cell that is pre-programmed to a logic high state. The dummy cell is physically the same size as a normal cell of the array and is manufactured using the same process. At the beginning of each read cycle, the dummy cell is selected for a time period necessary to pull the bit line to the predetermined reference voltage.

Connecting dummy cells to each bit line of a memory array that depends on single-ended bit cells provides several advantages. For example, process tracking is better than with many prior techniques because normal sized cells are used as the dummy cells. Also, the dummy cells can be located anywhere on the bit lines to provide the best possible sensing characteristics. Additionally, the present invention is applicable to both folded and unfolded bit line architectures. In addition, for folded bit line architectures, common mode noise rejection is better because the dummy cells are the same as the normal cells and are located very near to the selected cell. Furthermore, capacitive imbalances between the selected bit line and its reference line will be smaller.

Figure 1:
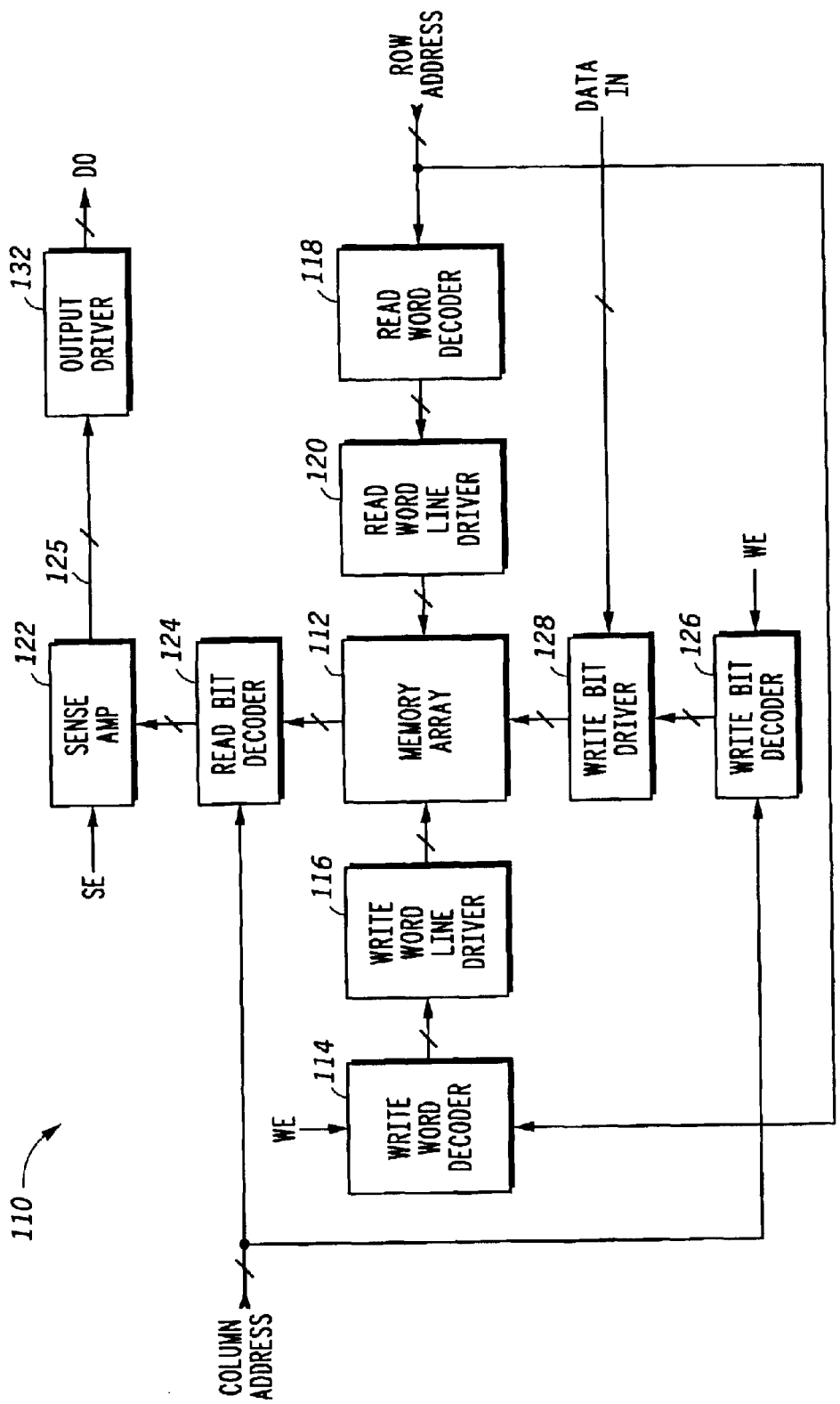
FIG. 1 illustrates, in block diagram form, an integrated circuit memory in accordance with one embodiment of the present invention.
Figure 2:
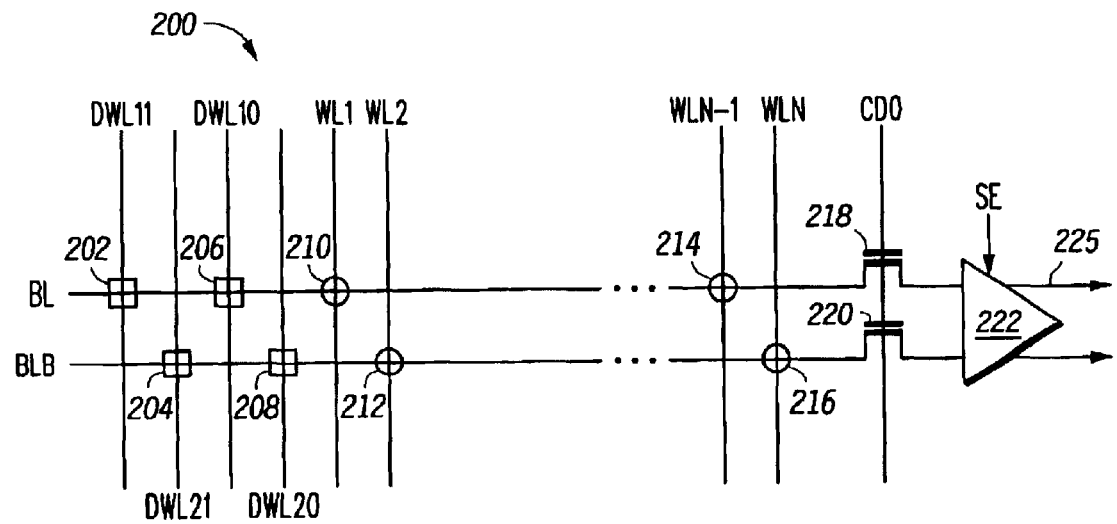
FIG. 2 illustrates, in partial block diagram form and partial schematic diagram form, one column of the memory array of FIG. 1.

FIG. 1 illustrates, in block diagram form, an integrated circuit memory in accordance with one embodiment of the present invention. Shown in FIG. 1 is a memory 110 comprising a memory array 112, a write word decoder 114, a write word line driver 116, a read word decoder 118, a read word line driver 120, one or more sense amplifiers 122, a read bit decoder 124, a write bit decoder 126, a write bit driver 128, and an output driver 132. These elements are coupled together by multiple lines. For example read bit decoder 124 receives a column address made up of multiple address signals. Memory array 112 is an array of memory cells coupled at the intersections of bit lines and word lines. A column of memory cells for the memory array 112 is shown in FIG. 2 and in one embodiment includes a plurality of magnetoresistive random access memory (MRAM cells. In other embodiment, memory array 112 may include any other nonvolatile memory cell that depends on single-ended sensing. Each MRAM cell of memory array 112 includes a read word line, a write word line. However, other MRAM cells may only have one word line for both reading and writing.

Read word decoder 118 receives a row address and is coupled to read word line driver 120, which in turn is coupled to memory array 112. For a read, read word decoder 118 selects a read word line in memory array 12 based on the row address. The selected word line is driven by read word line driver 120. Read bit decoder 124, which receives the column address and is coupled between sense amplifier 122 and memory array 112, selects a read bit line from read bit decoder 124, based on the column address, from memory array 112 and couples it to sense amplifier 122. Sense amplifier 122 detects the logic state and couples it to output driver 132. Output driver 132, for a read, provides a data output signal labeled "DO". Reading from memory array 112 in accordance with the present invention will be described in more detail below.

Write word decoder 114 receives the row address and is coupled to write word line driver 116, which in turn is coupled to memory array 112. For a write, write word decoder 114 selects a write word line, based on the row address, in memory array 112, and write word line driver in turn drives that selected write word line. Write bit decoder 126 receives the column address and is coupled to the write bit driver 128, which is coupled to the memory array 112. Writer bit decoder 126 selects a write bit line, based on the column address, and write bit driver 128 in turn drives the selected write bit line in order to change the state of the selected cell.

FIG. 2 illustrates, in partial block diagram form and partial schematic diagram form, a portion of the memory array of FIG. 1. The memory array will include many columns similar to memory cell portion 200. Memory cell portion 200 includes two bit lines, labeled BL and BLB, and all of the memory cells coupled to bit lines BL and BLB. For example, representative memory cells 210 and 214 are shown coupled to bit line BL, and representative memory cells 212 and 216 are shown coupled to bit line BLB. A bit line and the memory cells coupled to the bit line are commonly referred to as a column of memory cells. Note that in FIG. 2, the dummy cells are illustrated as squares and the normal cells are illustrated as circles. However, the dummy cells are physically the same as the normal cells. The only difference between a dummy cell and a normal cell is in their functions. Each of the memory cells is coupled to a word line for selecting the memory cells for read operations. For example, memory cell 210 is coupled to a word line labeled "WL1". Note that the illustrated embodiments are directed to read operations. Therefore, write operations are conducted according to the prior art and will not be described or illustrated in detail. Both bit lines are coupled to inputs of a sense amplifier 222 through column select transistors 218 and 220. Select transistors 218 and 220 are made conductive when a column decode signal labeled "CD0" is asserted by read bit decoder 124, (see FIG. 1) thus coupling bit lines BL/BLB to the inputs of sense amplifier 222. Sense amplifier 222 is one of the sense amplifier circuits located in sense amp 122 of FIG. 1. In one embodiment, there is one sense amplifier like sense amplifier 222 coupled to each pair of bit lines. In other embodiments, one sense amplifier may be "shared" by more than one bit line pair. The type of circuit used in sense amplifier 222 is not important for purposes of describing the invention. For example, sense amplifier 222 may include a cross-coupled pair of MOS transistors in one embodiment or may include a differential amplifier with a latch in another embodiment. Sense amplifier 222 has a sense enable input labeled "SE".

A pair of dummy cells is coupled to each bit line. Dummy cells 202 and 206 are coupled to bit line BL, and dummy cells 204 and 208 are coupled to bit line BLB. Dummy cell 202 is coupled to a dummy word line DWL11, dummy cell 206 is coupled to dummy word line DLW10, dummy cell 204 is coupled to dummy word line DWL21, and dummy cell 208 is coupled to dummy word line DWL20. Dummy cells 204 and 208 are selected by dummy word lines DWL21 and DWL20, respectively, each time a memory cell on bit line BL is read. Likewise, each time a memory cell on bit line BLB is read dummy cells 202 and 206 are selected by dummy word lines DWL11 and DWL10, respectively. In FIG. 2, dummy cells 202 and 204 are programmed to a logic high voltage and dummy cells 206 and 208 are programmed to a logic low voltage. The pair of dummy cells is used in a time-multiplexed manner to establish the reference voltage by which the read state of a selected memory cell is compared. That is, to establish a reference voltage about half way between a logic high voltage and a logic low voltage, each of the dummy cells is selected for about one half, or fifty percent, of a predetermined time period. The value of the reference voltage can be adjusted by changing how long the two dummy cells are selected relative to each other.

Figure 3:
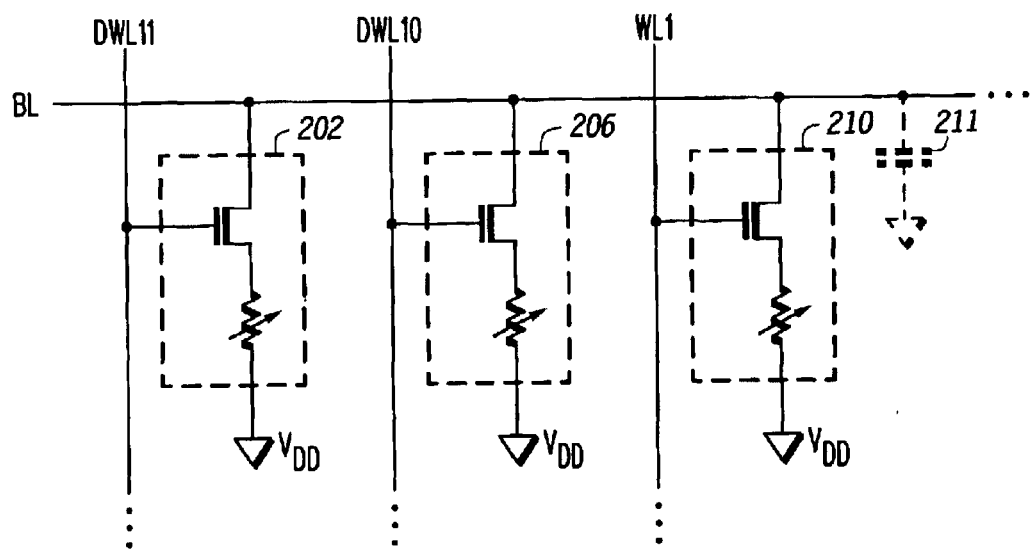
FIG. 3 illustrates, in schematic diagram form, one embodiment of the dummy cells for one bit line in FIG. 2.
Figure 4:
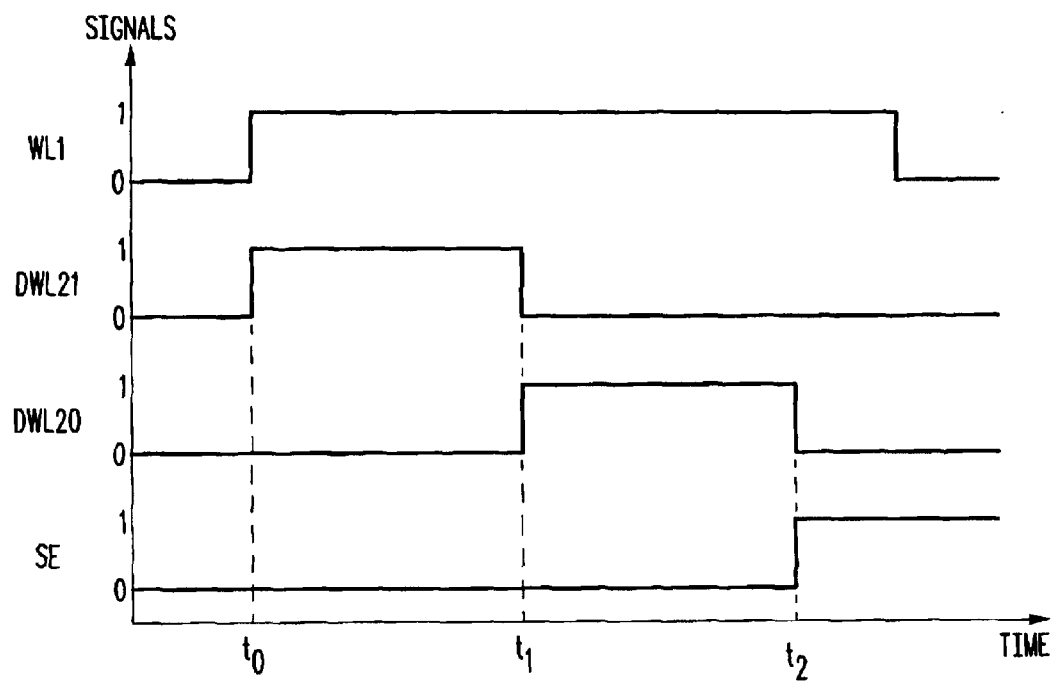
FIG. 4 illustrates a timing diagram of various signals in accordance with the embodiment in FIG. 2.
Figure 5:
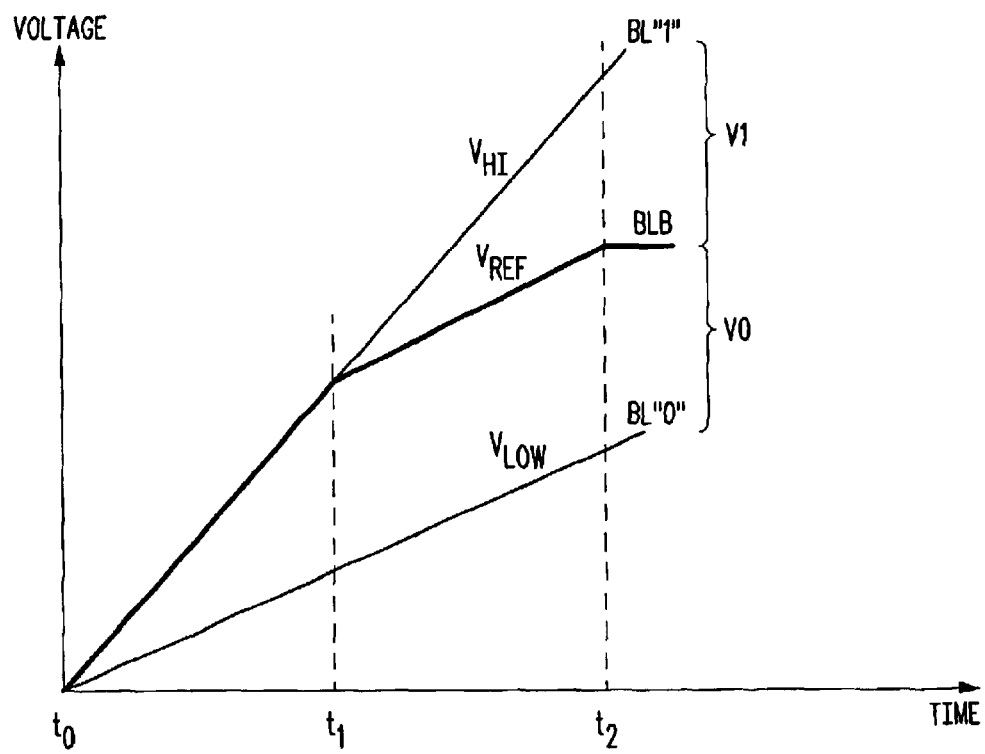
FIG. 5 illustrates a voltage vs. time graph for the embodiment of FIG. 2.

FIG. 3 illustrates, in schematic diagram form, dummy cells and normal cells connected to bit line BL in FIG. 2. In FIG. 3, dummy cells 202 and 206 are identical to normal cell 210. In the illustrated embodiment, they are MRAM cells having a magnetoresistive element coupled between a positive power supply voltage terminal labeled "VDD" and a select transistor. A parasitic capacitor 211 is coupled to bit line BL and represents a cumulative capacitance from all sources of capacitance coupled to bit line BL. Note that even though the invention is described using MRAM, the invention is not limited to MRAM, but can be used with other types of memory that rely on single-ended sensing. Also, note that even though the memory cell is coupled to a positive power supply voltage terminal in the illustrated embodiment, in other embodiments, the power supply voltage terminal VDD may be coupled to ground, or to a negative voltage. FIG. 4 illustrates a timing diagram of various signals of a read operation in accordance with the embodiment of FIGS. 2 and 3. FIG. 5 illustrates a voltage vs. time graph for a read operation for the embodiment of FIG. 3. A read operation of memory 110 in accordance with the embodiment of FIG. 3 will be described with reference to FIGS. 2–5.

At the beginning of a read operation, a memory cell is selected by asserting a column address and a row address. The row address selects a word line, for example word line WL1 in FIG. 3. The column address will select which bit line pair is coupled to a sense amplifier. For example, selecting word line WL1 and bit BL will allow the stored logic state of memory cell 210 to be read. At time t0 in FIG. 4 word line WL1 is asserted at a logic high voltage. Dummy cell 204, which is pre-programmed to store a logic high voltage, pulls bit line BLB at the same rate as a normal cell that is programmed to a logic high voltage. The dummy cells conduct the same amount of current as a normal cell that is programmed to the same logic state as the dummy cell. FIG. 5 illustrates the voltage VREF between times t0 and t1. At time t1, dummy word line DWL21 is deasserted and dummy word line DWL20 is asserted, causing dummy cell 208, which is pre-programmed at a logic low voltage, to pull bit line BLB at the same rate as a normal cell that is programmed to a logic low voltage. FIG. 5 illustrates the voltage VREF on BLB between times t1 and t2. The resulting reference voltage VREF at time t2 in FIG. 5 is about half way between the voltage VHI for a logic "1" and VLOW for a logic "0", where the voltage difference V1 equals approximately the voltage difference V2. At time t2, sense enable signal SE is asserted as a logic high voltage to enable sense amplifier 222 to sense and amplify the relatively small differential voltage on bit lines BL and BLB, and to provide the differential voltage to output driver 132. After time t2, WL1 returns to a logic low, ending the read operation. In the illustrated embodiment, the length of time between t0 and t1 is the same as the length of time between t1 and t2. The voltage of VREF can be changed by adjusting the predetermined length of time one or both of the dummy cells is coupled to the bit line. Also, the order in which the dummy cells are coupled to the bit line can be different in other embodiments.

Figure 6:
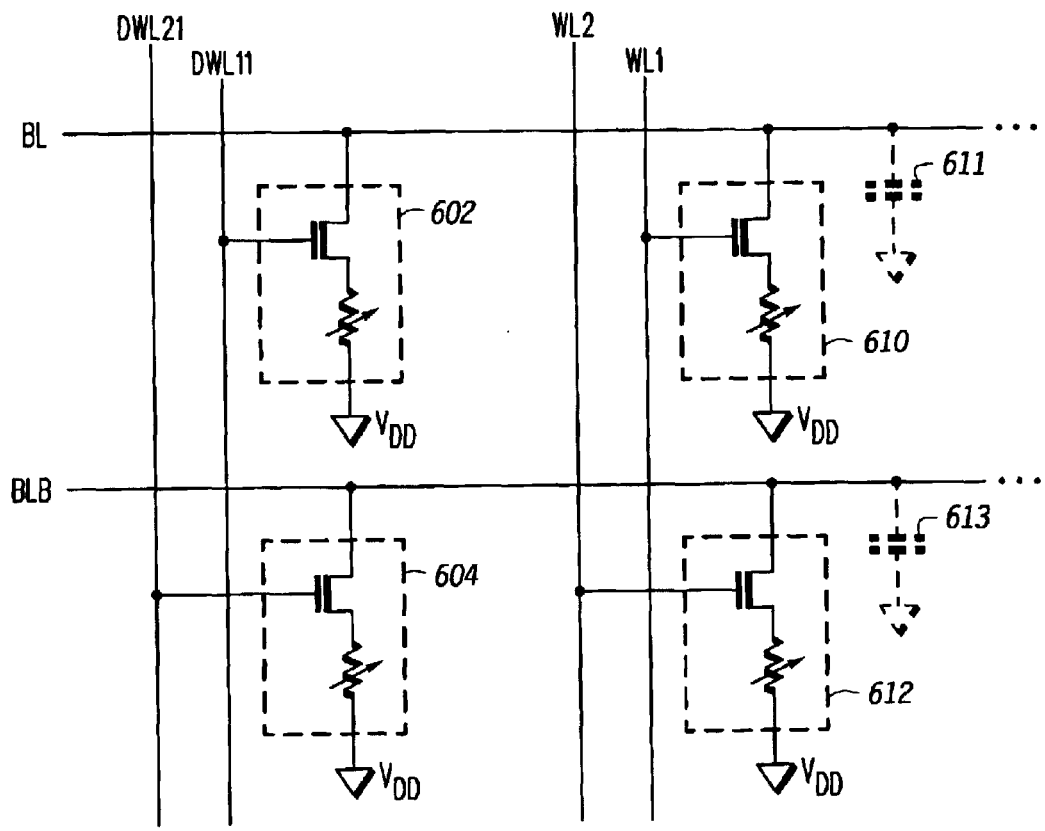
FIG. 6 illustrates, in schematic diagram form, a portion of a memory array in accordance with a second embodiment.

FIG. 6 illustrates, in schematic diagram form, a portion 600 of memory array 112 in accordance with a second embodiment. Memory array portion 600 includes MRAM representative dummy cells 602 and 604 and representative MRAM normal cells 610 and 612. FIG. 6 only shows one memory cell coupled to each bit line, however, as illustrated previously in FIG. 2, many memory cells will be coupled to each bit line as represented by the ampersands. Dummy cell 602 is coupled to a dummy word line DWL11 and to bit line BL. Dummy cell 604 is coupled to dummy word line DWL21 and to bit line BLB. Normal cell 610 is coupled to word line WL1 and to bit line BL. Normal cell 612 is coupled to word line WL2 and to bit line BLB. Bit line pair BL/BLB is coupled to a sense amplifier similar to sense amplifier 222 of FIG. 2. Parasitic capacitors 610 and 613 are coupled to bit lines BL and BLB, respectively. The dummy cells and the normal cells are the same size and are manufactured in the same process technology. Capacitor 610 represents a cumulative capacitance from all sources of capacitance coupled to bit line BL. Capacitor 613 represents a cumulative capacitance from all sources of capacitance coupled to bit line BLB.

As illustrated in FIG. 6, one dummy cell is coupled to each bit line. The dummy cell can be coupled anywhere on the bit line, and may track process variations with the normal memory cells more closely if placed in the middle of the bit line. Each dummy cell is programmed to store a logic high voltage. As with the previous embodiment of FIG. 2, each dummy cell has the same structure as the normal memory cells. During a read operation, the dummy cell provides a reference voltage at a predetermined level between the read voltages for a logic high state and a logic low state.

Figure 7:
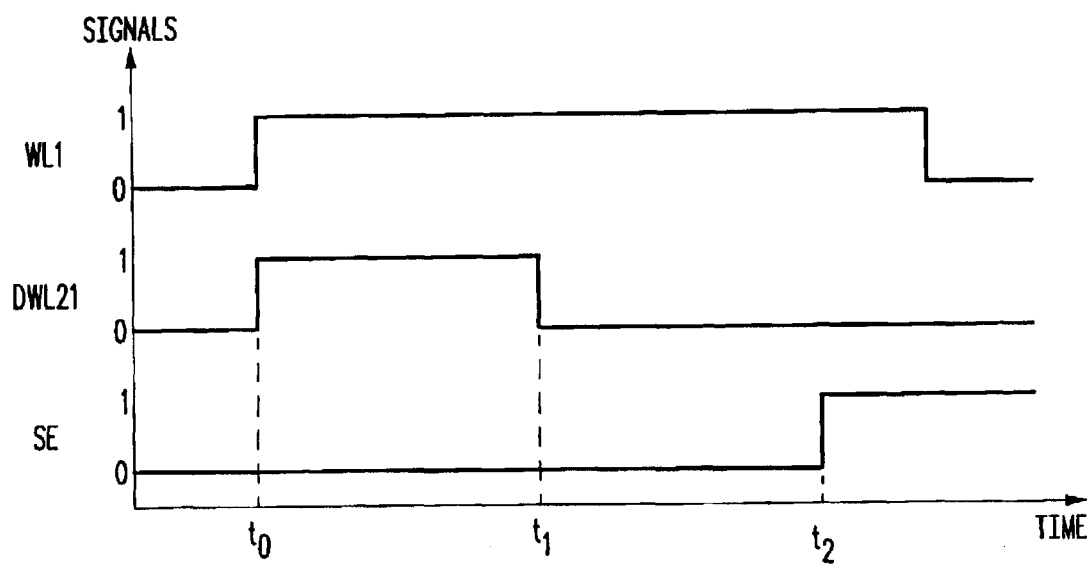
FIG. 7 illustrates a timing diagram of various signals in accordance with of the embodiment in FIG. 6.
Figure 8:
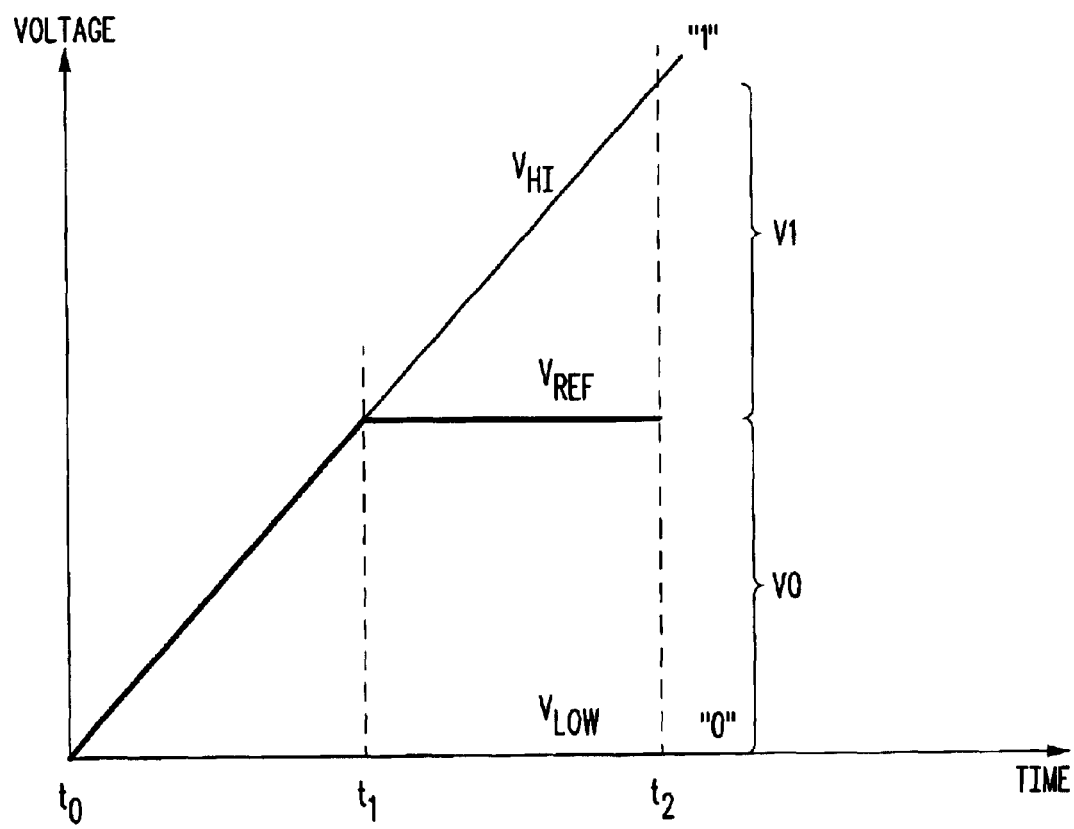
FIG. 8 illustrates a voltage vs. time graph for the embodiment of the FIG. 6.

FIG. 7 illustrates a timing diagram of various signals in accordance with of the embodiment in FIG. 6. FIG. 8 illustrates a voltage vs. time graph for the embodiment of the FIG. 6. A read operation of memory 110 in accordance with the embodiment of FIG. 6 will be described with reference to both FIGS. 7 and 8. At the beginning of a read operation, a memory cell, for example, memory cell 610 is selected by asserting a column address and a row address. The row address selects a word line, for example word line WL1 in FIG. 6. The column address will select which bit line pair is coupled to a sense amplifier. For example, selecting word line WL1 and bit BL will allow the stored logic state of memory cell 610 to be read. At time t0 in FIG. 7 word line WL1 is asserted at a logic high voltage. Also, dummy word line DWL21 is asserted, connecting dummy cell 604 to bit line BLB. DWL21 is asserted for a predetermined time period to pull the voltage of bit line BLB to a voltage half way between a logic high "1" voltage VHI and a logic low "0" voltage VLOW, where the voltage difference V1 equals approximately the voltage difference V2. FIG. 8 illustrates the voltage VREF, and the voltages VHI and VLOW between times t0 and t1. At time t1, dummy word line DWL21 is deasserted, causing dummy cell 604 to be decoupled from bit line BLB. The voltage VREF on bit line BLB will stop increasing. At time t2, sense enable signal SE is asserted as a logic high voltage to enable the sense amplifier to sense and amplify the relatively small differential voltage on bit lines BL and BLB, and to provide the differential voltage to output driver 132. After time t2, WL1 returns to a logic low, ending the read operation.

The method and apparatus for establishing a reference voltage in accordance with the present invention provides the advantage of better process tracking than that provided with many prior techniques because normal sized cells are used as the dummy cells. Also, the dummy cells can be located anywhere on the bit lines to provide the best possible sensing characteristics. Additionally, the present invention is applicable to both folded and unfolded bit line architectures. In addition, for folded bit line architectures, common mode noise rejection is better because the dummy cells are the same as the normal cells and are located very near to the selected memory cell. Furthermore, capacitive imbalances between the selected bit line and its reference line will be smaller.

In the illustrated embodiment, the memory cells and dummy cells are MRAM cells having a magnetoresistive element coupled between a power supply voltage labeled "VDD" and a select transistor. However, in other embodiments, the memory types that can benefit from the invention are not limited to MRAM, but can be other types of memory that rely on single-ended sensing, such as flash (and other nonvolatile memory types that use floating gate transistors), ferroelectric memory devices, and DRAM.

Various changes and modifications to the embodiments herein chosen for purposes of illustration will readily occur to those skilled in the art. For example, variations in the types of conductivities of transistors, the types of transistors, etc. may be readily made. To the extent that such modifications and variations do not depart from the scope of the invention, they are intended to be included within the scope thereof, which is assessed only by a fair interpretation of the following claims.

What is claimed is:

1. A memory comprising:
   a plurality of addressable storage cells, each of the plurality of addressable storage cells being formed at an intersection of a predetermined one of a plurality of word lines and a predetermined one of a plurality of bit lines and forming an array that is addressed by bit lines and word lines;
   one or more dummy cells coupled to each bit line for establishing a reference voltage on the bit line by conducting current only for a predetermined portion of a time period less than one hundred percent of time when a word line controlling a storage cell connected to the bit line is active; and a sense amplifier coupled to the plurality of addressable storage cells for sensing whether an addressed storage cell is programmed to a logic zero or a logic one state.

2. The memory of claim 1 wherein the one or more dummy cells further comprises:

a first memory cell connected to a predetermined bit line for conducting a first predetermined amount of current in the predetermined bit line for a first percentage of time of the time period; and a second memory cell connected to the predetermined bit line for conducting a second predetermined amount of current in the predetermined bit line for a remainder of time of the time period.

3. The memory of claim 1 wherein the first predetermined amount of current corresponds to current conducted by the first memory cell when the first memory cell is programmed to a logic one state, and the second predetermined amount of current corresponds to current conducted by the second memory cell when the second memory cell is programmed to a logic zero state.

4. The memory of claim 1 wherein the first predetermined amount of time is substantially fifty percent of the time period and the remainder of time of the time period is substantially fifty percent of the time period.

5. The memory of claim 1 wherein the first predetermined amount of time and the remainder of time are selected so that the reference voltage on the bit line is substantially half way between a logic low voltage on the bit line when a selected memory cell is programmed to a logic zero state and a logic high voltage on the bit line when the selected memory cell is programmed to a logic high state.

6. The memory of claim 1 wherein the one or more dummy cells further comprise:

a single memory cell connected to a predetermined bit line for substantially fifty percent of the time period, the single memory cell conducting a predetermined amount of current in the predetermined bit line.

7. The memory of claim 6 wherein the predetermined amount of current corresponds to current conducted by the single memory cell when the single memory cell is programmed to a logic one state.

8. The memory of claim 1 wherein the plurality of addressable storage cells comprise a plurality of magnetoresistive random access memory (MRAM) cells.

9. The memory of claim 1 wherein the plurality of addressable storage cells comprise a plurality of flash memory cells.

10. The memory of claim 1 further comprising:

a decoder coupled to each of the plurality of bit lines between predetermined cells of the plurality of addressable storage cells and the sense amplifier, the decoder selecting a predetermined bit line and differential bit line in the array to sense.

11. A memory comprising:

an array of memory cells forming a bit line column and differential bit line column, each bit line column and differential bit line column containing two dummy cells connected serially with a plurality of memory cells;

addressing circuitry coupled to the array of memory cells, the addressing circuitry providing at least three word line signals to read each memory cell of the array of memory cells; and sense circuitry coupled to the array of memory cells, the sense circuitry comparing voltage of a predetermined bit line column with voltage of a corresponding differential bit line column to determine whether an addressed memory cell has a logic one or a logic zero state.

12. The memory of claim 11 wherein a first dummy cell of the two dummy cells is controlled by a first of the at least three word line signals and is programmed to a logic one state, and a second dummy cell of the two dummy cells is controlled by a second of the at least three word line signals and is programmed to a logic zero state.

13. The memory of claim 11 wherein the first and the second of the at least three word line signals are time multiplexed to be asserted at substantially different times during a selection of a memory cell in a same bit line column containing the two dummy cells.

14. The memory of claim 11 wherein the two dummy cells are selected at different points in time during a time when a selected memory cell of a corresponding bit line column is selected to establish a reference voltage for the sense circuitry.

15. A method of creating a reference voltage in a memory for sensing, comprising:

coupling one or more dummy cells in each of a bit line and a differential bit line to a plurality of memory cells, each of the one or more dummy cells being programmed to a predetermined logic state;

coupling the bit line and a differential bit line to a sense amplifier;

selecting a predetermined one of the plurality of memory cells coupled to either the bit line or the differential bit line by reading the predetermined one of the plurality of memory cells for a predetermined time;

time multiplexing activation of the one or more dummy cells in the bit line or the differential bit line not associated with the predetermined one of the plurality of memory cells being read for an amount of time less than one hundred percent of the predetermined time to establish a reference voltage; and sensing and comparing the reference voltage with a read voltage created by the predetermined one of the plurality of memory cells that is selected to determine a logic state of the predetermined one of the plurality of memory cells that is selected.

16. The method of claim 15 wherein the time multiplexing further comprises:

activating only one dummy cell for substantially fifty percent of the predetermined time to establish the reference voltage at a voltage that is substantially one-half between a logic low voltage when a selected memory cell is programmed to a logic zero state and a logic high voltage when the selected memory cell is programmed to a logic high state.

17. The method of claim 15 wherein the time multiplexing further comprises:

activating a first dummy cell for substantially a first half of the predetermined time, and activating a second dummy cell for substantially a second half of the time period to establish the reference voltage.

18. The method of claim 15 further comprising:

implementing the dummy cells and the plurality of memory cells as magnetoresistive random access memory cells having a resistance that varies depending upon whether programmed as a logic one or a logic zero, each of the mangetoresistive random access memory cells having a control electrode connected to a predetermined word line and connected between a predetermined bit line and a reference voltage terminal.

19. The method of claim 15 further comprising:

implementing the dummy cells and the plurality of memory cells as either flash memory cells or dynamic random access memory cells.

20. The method of claim 15 further comprising physically placing the bit line and the differential bit line in a folded architecture comprising substantially parallel adjacent placement of the bit line and the differential bit line, or physically placing the bit line and the differential bit line in an unfolded architecture comprising physically non-adjoining placement of the bit line and the differential bit line.

* * * * *